United States Patent
Vella et al.

(10) Patent No.: US 9,782,771 B2
(45) Date of Patent: Oct. 10, 2017

(54) METHOD FOR MAKING HYDROPHOBIC BARRIERS REQUIRING UV-LIGHT TREATMENT

(71) Applicant: XEROX CORPORATION, Norwalk, CT (US)

(72) Inventors: Sarah J. Vella, Milton (CA); Jennifer L. Belelie, Oakville (CA); Barkev Keoshkerian, Thornhill (CA); James D. Mayo, Mississauga (CA); Brynn Dooley, Toronto (CA)

(73) Assignee: XEROX CORPORATION, Norwalk, CT (US)

( * ) Notice: Subject to any disclaimer, the term of this patent is extended or adjusted under 35 U.S.C. 154(b) by 124 days.

(21) Appl. No.: 14/599,170

(22) Filed: Jan. 16, 2015

(65) Prior Publication Data
US 2016/0207039 A1   Jul. 21, 2016

(51) Int. Cl.
| | | |
|---|---|---|
| *B01L 3/00* | (2006.01) | |
| *D21H 21/16* | (2006.01) | |
| *D21H 23/50* | (2006.01) | |
| *D21H 19/48* | (2006.01) | |
| *D21H 25/04* | (2006.01) | |
| *D21H 27/02* | (2006.01) | |
| *B81C 1/00* | (2006.01) | |

(52) U.S. Cl.
CPC .......... *B01L 3/502707* (2013.01); *B81C 1/00* (2013.01); *D21H 19/48* (2013.01); *D21H 21/16* (2013.01); *D21H 23/50* (2013.01); *D21H 25/04* (2013.01); *D21H 27/02* (2013.01); *B01L 2300/0816* (2013.01); *B01L 2300/126* (2013.01); *B01L 2300/165* (2013.01)

(58) Field of Classification Search
CPC ...... B01L 3/502707; B81C 1/00; D21H 19/48
See application file for complete search history.

(56) References Cited

U.S. PATENT DOCUMENTS

| | | | |
|---|---|---|---|
| 5,231,135 A | 7/1993 | Machell et al. | |
| 5,621,022 A | 4/1997 | Jaeger et al. | |
| 6,221,137 B1 | 4/2001 | King et al. | |
| 7,279,587 B2 * | 10/2007 | Odell | C07C 233/34 554/37 |
| 8,377,710 B2 | 2/2013 | Whitesides et al. | |

(Continued)

FOREIGN PATENT DOCUMENTS

| | | |
|---|---|---|
| WO | 2008007359 A2 | 1/2008 |
| WO | 2010003188 A1 | 1/2010 |

(Continued)

*Primary Examiner* — Dah-Wei D Yuan
*Assistant Examiner* — Kristen A Dagenais
(74) *Attorney, Agent, or Firm* — MH2 Technology Law Group LLP

(57) ABSTRACT

Provided is a method of patterning a substrate. The method includes depositing, in a first predetermined pattern, hydrophobic material on a first surface of a hydrophilic substrate. The method includes permeating the hydrophobic material through a thickness of the substrate. The method includes exposing the hydrophobic material to UV-light and sufficiently solidifying the permeated hydrophobic material. The sufficiently solidified hydrophobic material forms a liquid-impervious barrier that separates the substrate into at least one discrete region.

17 Claims, 12 Drawing Sheets

(56) References Cited

U.S. PATENT DOCUMENTS

2012/0198684 A1* 8/2012 Carrilho ............ B01L 3/502707
   29/527.1
2013/0084630 A1* 4/2013 Rolland ................ G01N 21/78
   435/287.8

FOREIGN PATENT DOCUMENTS

| WO | 2010022324 A2 | 2/2010 |
| WO | 2013071301 A1 | 5/2013 |

* cited by examiner

METHOD FOR MAKING HYDROPHOBIC BARRIERS REQUIRING UV-LIGHT TREATMENT

FIELD

This disclosure is generally directed to methods for forming microfluidic devices, including methods of patterning substrates, including methods of patterning a porous, hydrophilic substrate into hydrophobic, and hydrophilic regions, and including a method of depositing hydrophobic material on the substrate and curing the hydrophobic material with ultraviolet (UV) light.

BACKGROUND

Paper-based microfluidic analytical devices are attractive for use in settings where conventional laboratory diagnostics are unsuitable or undesirable, for example, in developing regions, remote regions, emergency situations, and home healthcare. Paper-based devices comprise paper, wax and assay reagents that are pre-deposited onto the paper. Typically, hydrophobic regions patterned in the paper substrate may define isolated hydrophilic zones of the paper substrate for conducting, for example, biological assays, or hydrophilic channels that may direct the movement of fluid to an assay zone.

Known methods for forming such regions include printing, for example, via jetting, of wax-based ink onto the surface of a paper substrate, followed by heating of the substrate to melt (reflow) the wax through the thickness of the paper, leading to the formation of hydrophobic barriers that define hydrophilic regions of paper substrate. Because the conventional, wax-based inks are designed to stay on top of paper after being jetted, the heating step is necessary so that the wax reflows to penetrate the thickness of the paper to create the isolated hydrophilic zones.

As depicted in FIG. 11A and FIG. 11B, one limitation of such a method is that the conventional wax ink must be melted 9 reflowed after it is deposited on the substrate in order to penetrate into the substrate, and such melted wax ink spreads isotropically through the paper.

SUMMARY

In an embodiment, there is a method of patterning a substrate. The method includes depositing, in a first predetermined pattern, hydrophobic material on a first surface of a hydrophilic substrate. The method includes permeating the hydrophobic material through a thickness of the substrate. The method includes exposing the hydrophobic material to UV-light and sufficiently solidifying the permeated hydrophobic material. The sufficiently solidified hydrophobic material forms a liquid-impervious barrier that separates the substrate into at least one discrete region.

In another embodiment, there is a method of forming a microfluidic device. The method includes depositing, in a first predetermined pattern, a hydrophobic material on a first surface of a hydrophilic substrate. The method further includes permeating the hydrophobic material through a thickness of the substrate without reflowing the deposited hydrophobic material. The method further includes exposing the hydrophobic material to UV-light. The method includes forming a liquid-impervious barrier by sufficiently solidifying the permeated hydrophobic material. The substrate may include a sample receiving region, an assay region and a channel region.

Advantages of at least one embodiment include improved resolution of printed features that form hydrophobic barriers. An advantage of at least one embodiment includes improved integrity of hydrophobic barriers. An advantage of an embodiment includes methods that provide for the fabrication of patterned hydrophobic barriers that are impervious to liquids used in performing assays.

Additional advantages of the embodiments will be set forth in part in the description which follows, and in part will be understood from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the embodiments, as claimed.

The accompanying drawings, which are incorporated in and constitute a part of this specification, and together with the descriptions, serve to explain the principles of the embodiments.

DESCRIPTION OF THE EMBODIMENTS

Figure 1A:
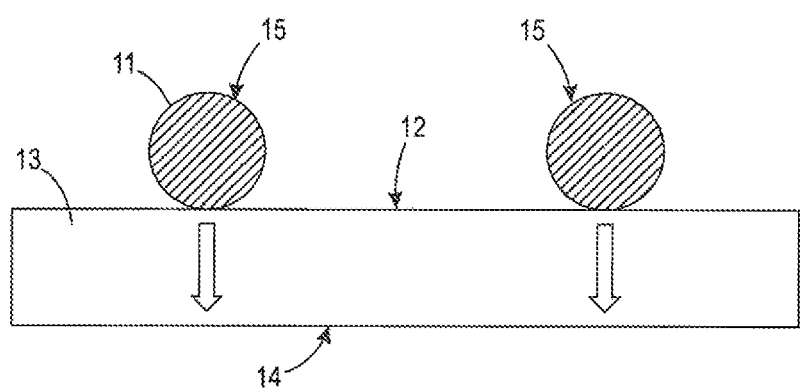
FIGS. 1A-1B illustrate performing a method of patterning a substrate according to an embodiment.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

As used herein, the term "curable" refers, for example, to the component or combination being polymerizable, that is, a material that may be cured via polymerization, including for example free radical routes, and/or in which polymerization is photoinitiated through use of a radiation sensitive photoinitiator. Thus, for example, the term "radiation curable" is intended to cover all forms of curing upon exposure to a radiation source, including light and heat sources and including in the presence or absence of initiators. Example radiation curing routes include, but are not limited to, curing using ultraviolet (UV) light referred to herein as ""UV-light-curable" which means curing with light having, for example, a wavelength of 200-400 nm, such as in the presence of photoinitiators and/or sensitizers, curing using e-beam radiation, such as in the absence of photoinitiators, curing using thermal curing, in the presence or absence of high temperature thermal initiators (and which are generally largely inactive at the jetting temperature), and appropriate combinations thereof.

Embodiments described herein include a method that uses UV-light-curable hydrophobic material, such as a UV-light-curable, phase-change ink, that is formulated to directly wick through a hydrophilic substrate (e.g. paper) and that is subsequently cured using UV-light to prevent further migration of the hydrophobic material, and to sufficiently solidify the hydrophobic material to generate hydrophobic barriers. An advantage of the embodiments is that such methods eliminate the need for a post-printing heating step that is otherwise required for wax inks that must be melted (reflowed) after being deposited. Additionally, the embodiments also provide for a higher resolution of deposited hydrophobic features as compared to, for example, such patterns formed with conventional formulations that require reflowing and/or spread isotropically, or, said another way, as compared to conventional methods that require or utilize post-printing heating (reflowing).

As used herein the phrase "without reflowing the deposited hydrophobic material" means that no post-printing or post-depositing heating step is required to, for example, melt (reflow) hydrophobic material deposited on a substrate, such as a hydrophilic substrate. In other words, "without reflowing the deposited hydrophilic material" includes methods in which hydrophobic material deposited or printed on a substrate in a flowable phase that does not become unflowable, for example, solid, after being deposited on the substrate and before penetrating through a thickness of the substrate. That is, "without reflowing the deposited hydrophobic material" provides that the hydrophobic material penetrates into a thickness of a substrate on which it is deposited directly after printing. Thus, a flowable phase of hydrophobic material that is deposited on a substrate "without reflowing" after the depositing on the substrate's surface, means that no heating step is needed to allow the hydrophobic material to flow/penetrate into and through a thickness of the substrate. In contrast, conventional methods utilize inks having properties that prevent the ink from penetrating through the substrate upon being deposited on a surface of the substrate without additional assistance. Thus, the conventional methods require a post-deposition reflowing (heat and/or pressure) step in order to change the deposited material back into a flowable phase for it to penetrate into the substrate.

As illustrated in FIGS. 1A-1B, and FIGS. 2A-2B, a method of patterning a substrate includes depositing hydrophobic material 11 in a predetermined pattern 15 on a first surface 12 of a substrate, such as a hydrophilic substrate 13. As indicated by the downward pointing arrows in FIG. 1A, the method includes permeating the hydrophobic material 15 through a thickness of the substrate 13, for example, without having to reflow the deposited hydrophobic material. In an embodiment, the permeating occurs anisotropically through the thickness of the substrate on which the hydrophobic material is deposited. It should be noted that one result of the hydrophobic material spreading anisotropically through the substrate is that a width of features formed by the hydrophobic material on a top side (e.g., first surface 12) of the substrate and a width of the features formed by the hydrophobic material on a back side (e.g., second surface 14) of the substrate will be defined by lower rate of spreading of the hydrophobic material, for example, in a direction parallel to a surface plane of the substrate as compared to a rate of spreading of the hydrophobic material through a thickness of the substrate. In other words, in an embodiment, the hydrophobic material spreads more quickly through a thickness of the substrate than it does on a surface of the substrate. While not limited to any particular embodiment, it is believed that anisotropic spreading of the hydrophobic material through a thickness of the substrate provides for higher resolution and better hydrophobic barriers (e.g., a higher concentration of hydrophobic material in a barrier formed within a narrower region of the substrate). Thus, one advantage of the anisotropic spreading of the hydrophobic material in methods described herein leads to sharper features (higher resolution) on both sides of a substrate, such as a paper substrate, and better integrity of barriers formed by the hydrophobic material within the substrate as compared to, for example, barriers formed by materials that penetrate isotropically instead of anisotropically.

Figure 1B:
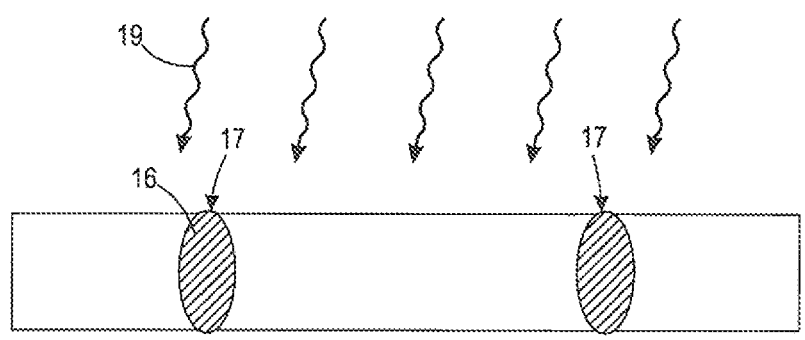

As illustrated in FIG. 1B; the hydrophobic material migrates through a thickness of the substrate 13. In an embodiment, the hydrophobic material 11 permeates to, and deposits itself, on a second surface 14 that opposes the first surface. By at least exposing 19 the hydrophobic material 11 to, for example, UV-light, the permeated hydrophobic material is sufficiently solidified to form a liquid-impervious barrier 17. For example, the permeated hydrophobic material is cured, for example, via exposure to the UV-light, to form barrier 17. Accordingly, in an embodiment, barrier 17 separates the substrate into at least one discrete region, that is, regions through which a liquid may permeate within the substrate but are blocked by the barrier 17 from penetrating other portions of the substrate.

In an embodiment, at least one of vertical and horizontal migration of the hydrophobic material ceases upon curing. It should be noted that the hydrophobic material need not permeate through the entire thickness, although in some embodiments it does so. Thus, in an embodiment, the hydrophobic material may be solidified upon eating such that its migration through the substrate ceases at a location between the first surface 12 and a second surface 14.

Figure 2A:
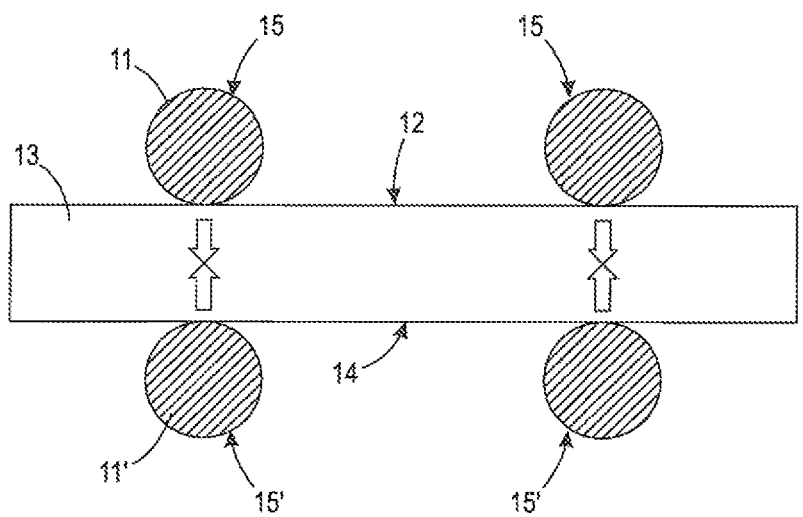
FIGS. 2A-2B illustrate performing a method of patterning a substrate according to an embodiment.
Figure 2B:
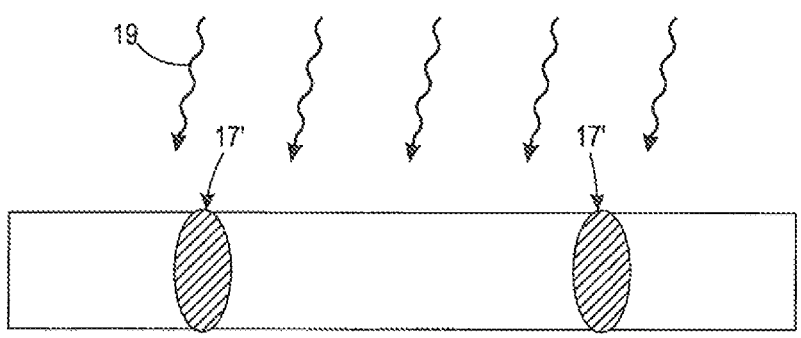

The method illustrated in FIGS. 2A-2B shows a further step, for example, a step in addition to at least one of the steps in the method illustrated in FIGS. 1A-1B. That is, FIG. 2A illustrates depositing a hydrophobic material 11 on the first surface 12 in a predetermined pattern 15 and depositing a hydrophobic material 11' in a predetermined pattern 15' on a second surface 14 of the substrate 13, wherein the second surface 14 opposes the first surface 12. A hydrophobic material 11 deposited on the first surface 12 in a predetermined pattern 15 may be the same or different, that is, may have the same or different formulation, as compared to the hydrophobic material 11'. For example, the hydrophobic materials 11 an 11' may have the same or different components, same or different ratios of components, same or different properties such as viscosity or pH, or combinations thereof. Additionally, the first predetermined pattern 15 and the second predetermined pattern 15' may be the same pattern or maybe different patterns. As described further below, the first and second predetermined patterns of hydrophilic material may be deposited by printing or stamping. In an embodiment, the first and second predetermined patterns may be formed by depositing the hydrophobic material via inkjet printing, for example, via jetting hydrophobic material through nozzle of an inkjet printer and onto a substrate. Thus, the depositing hydrophobic material may comprise printing or stamping. In an embodiment, the depositing comprises digital printing, screen printing, flexo printing, or gravure printing. In an embodiment, the depositing includes depositing the hydrophobic material, wherein a temperature of the hydrophobic material when deposited comprises about 70° C. to about 150° C., such as a temperature of about 100° C. to about 145° C., including 130° C. to about 140° C.

As shown in FIG. 2A, at least a portion of the pattern 15 of deposited hydrophobic material 11 and a portion of the second pattern 15 of deposited hydrophobic material 11' may overlap. For example, at least a portion of hydrophobic material 11 may be deposited in a pattern 15 at a location on first surface 12 of the substrate 13 formed opposite a location on second surface 14 on which at least a portion of hydrophobic material 11' is deposited such that a thickness of the substrate 13 separates the pattern 15 and the pattern 15'. Additionally, hydrophobic material 11 and hydrophobic material 11' may be deposited simultaneously, or one after the other. For example, pattern 15 of hydrophobic material 11 may be formed at the same time as, before, or at a later time than pattern 15' of hydrophobic material As shown in FIG. 2B, at least a portion of hydrophobic material 11 deposited in the first predetermined pattern 15 and/or a portion of hydrophobic material 11' deposited in the second predetermined pattern 15' penetrate into the substrate, for example, in at least the directions indicated by the downward pointing arrow with respect to hydrophobic material 11 and the upward pointing arrow with respect to hydrophobic material 11', and contact each other somewhere within the substrate 13. By meeting somewhere within the substrate 13, hydrophobic material 11 and hydrophobic material 11' that penetrate through a thickness of the substrate provide for the formation of a barrier 17' that forms upon at least exposing 19 the hydrophobic material 11 to an energy source, such as a UV-light source, and sufficiently solidifying hydrophobic material 11 and hydrophobic material 11', such as via curing thereof. It should be noted that a formulation of hydrophobic material 11 may be the same or different as a formulation of hydrophobic material 11'. For example, hydrophobic material 11 and hydrophobic material 11' may have the same or different formulations. Thus, in an embodiment, one or both of hydrophobic material 11 and hydrophobic material 11' are UV-light-curable hydrophobic material(s), such as UV-light-curable, phase-change inks.

Figure 3A:
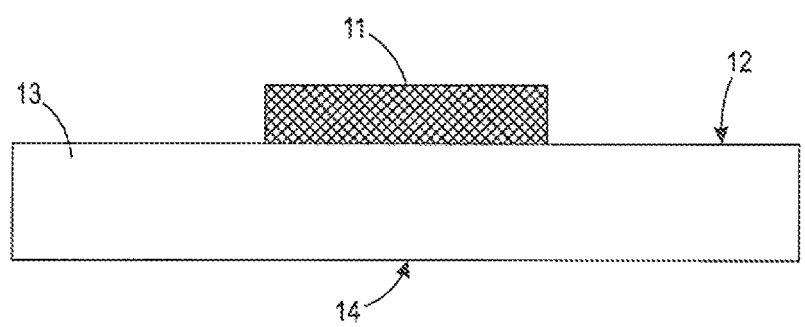
FIGS. 3A-3D illustrate performing a method of patterning a substrate according to an embodiment.
Figure 3B:
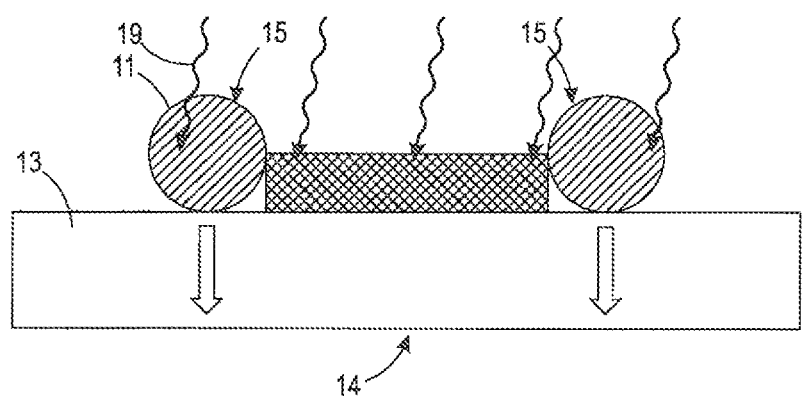
Figure 3C:
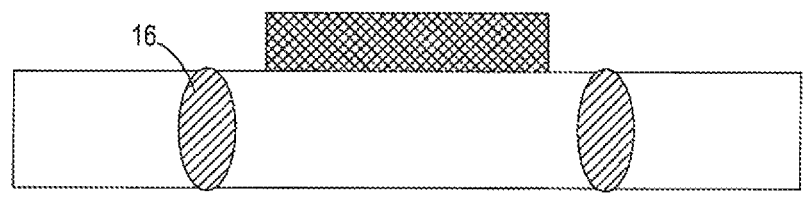
Figure 3D:
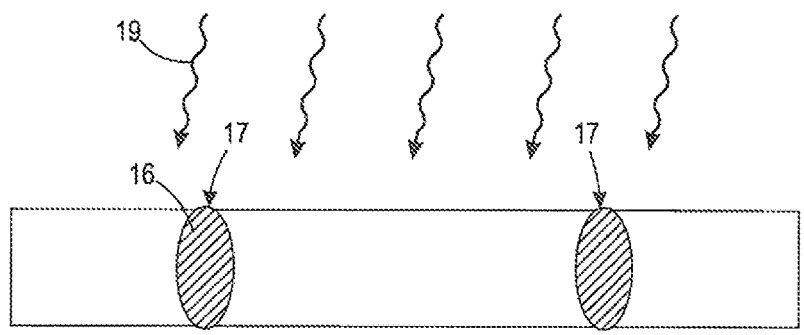

In an embodiment, the first, predetermined pattern 15 and second predetermined pattern 15' may be formed by depositing hydrophobic material through a mask pattern, such as through openings of a mask pattern, and onto a substrate as illustrated in FIGS. 3A-3D. For example, a method of patterning a substrate that includes, forming a mask 10 on a surface, for example, surface 12, of substrate 13 as shown in FIG. 3A. Alternatively, or in addition, hydrophobic material may be deposited on second surface 14. Mask 10 may be formed according to known methods in the art appropriate for depositing and patterning mask 10, which may depend on the material or materials selected for mask 10. Thus, depositing hydrophobic material 11 in a predetermined pattern 15, may include depositing hydrophobic material 11 through openings of mask 10 such as on a first surface 12 of a substrate 13 that is not covered by mask 10. As indicated by the downward pointing arrows in FIG. 3B, the method includes permeating the hydrophobic material 15 through a thickness of the substrate 13, for example, without having to reflow the deposited hydrophobic material. As illustrated in FIG. 3C; the hydrophobic material migrates through a thickness of the substrate 13 at least through portions underlying the surface portions of substrate 13 not covered by mask 10, in an embodiment, mask 10 may be removed in an additional step (not shown) performed between the steps illustrated in FIGS. 3A and 3B, and/or in an additional step (not shown) performed between the steps illustrated in FIGS. 3C and 3D. As illustrated in FIG. 3D, in an embodiment, the hydrophobic material permeates to, and deposits itself, on a second surface 14 that opposes the first surface 12. In the method, the permeated hydrophobic material is at least exposed 19 to an energy source, such as UV-light, and is sufficiently solidified to form a liquid-impervious barrier 17, for example, via curing as a result of exposure to the energy source. For example, the permeated hydrophobic material is cured to form barrier 17.

In an embodiment, barrier 17 separates the substrate into at least one discrete region. That is, barrier 17 separates the substrate into at least one discrete region through which a liquid, such as an assay sample, may permeate within the substrate. The liquid, however, is blocked (by the barrier 17) from penetrating other portions of the substrate. Thus, a barrier 17 is defined by permeation and solidification of hydrophobic material 11, the permeation beginning at surface portions of substrate 13 on which hydrophobic material is deposited, such surface portions not covered by a mask 10 and continuing through a thickness of the substrate until migration of the material ceases. In an embodiment, migration of the hydrophobic material ceases at a location between first surface 12 and second surface 14.

Figure 4:
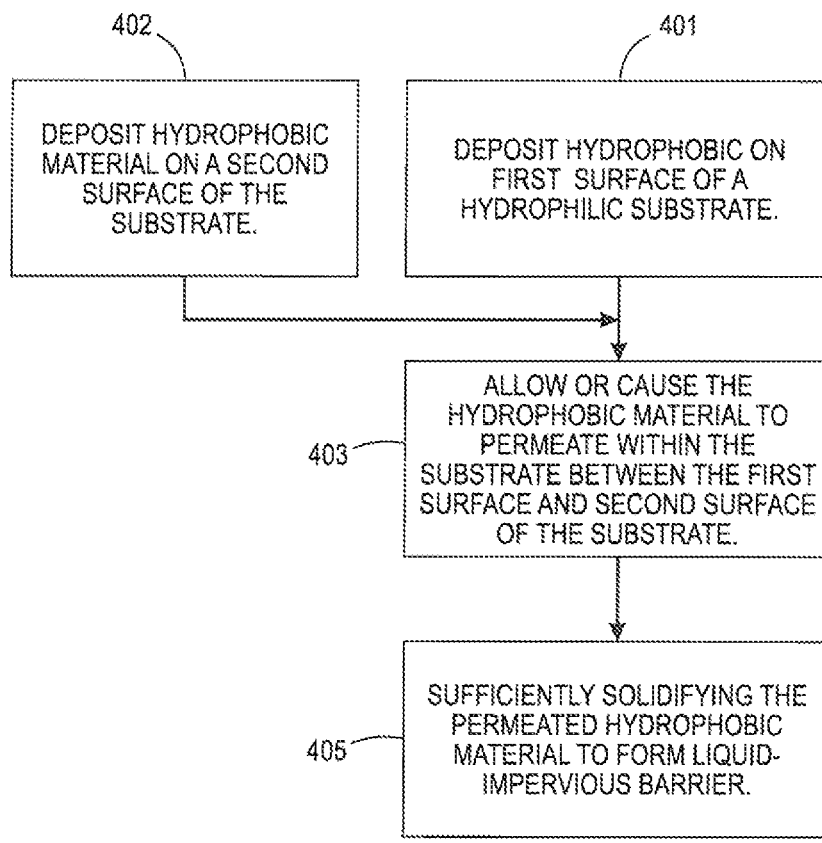
FIG. 4 is a flow-chart that describes a method of patterning a substrate according to an embodiment.

FIG. 4 includes a flow chart 400 that describes steps of a method of an embodiment. For example, at 401 hydrophobic material, such as UV-light-curable hydrophobic material, for example, a UV-light curable, phase-change ink, is deposited on a first surface of a hydrophilic substrate. In an embodiment, hydrophic material, such as UV-light-curable hydrophobic material, for example, a UV-light curable, phase-change ink, may be deposited on a second surface of the substrate as in 402. The hydrophobic material(s) is/are then allowed or caused to permeate within the substrate, such as through the substrate, for example, between a first surface and a second surface of the substrate at 403. At 405, the permeated hydrophobic material is cured, for example, via exposure to UV-light, and is sufficiently solidified, for example, as a result of curing, to form a liquid impervious barrier. It should be noted that the hydrophobic material in step 401 and the hydrophobic material in step 402 may be the same or different formulations of hydrophobic material, and at least one of such formulations may be a UV-light-curable hydrophobic formulation, such as a UV-light-curable, phase-change ink.

Figure 5A:
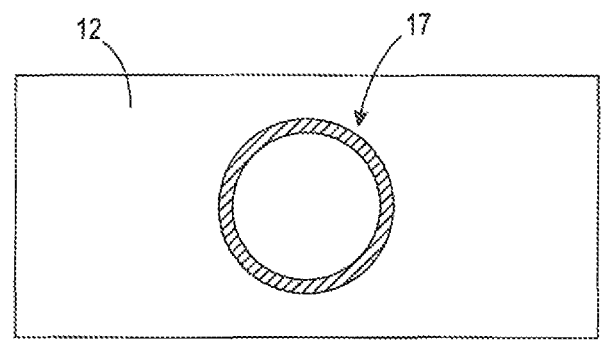
FIGS. 5A-5B illustrate a top/front view (FIG. 5A) and a bottom/back view (FIG. 5B) of a patterned substrate that may be formed according to methods of the embodiments illustrated in any of FIG. 1A-1B, 2A-2B, or 3A-3D.
Figure 5B:
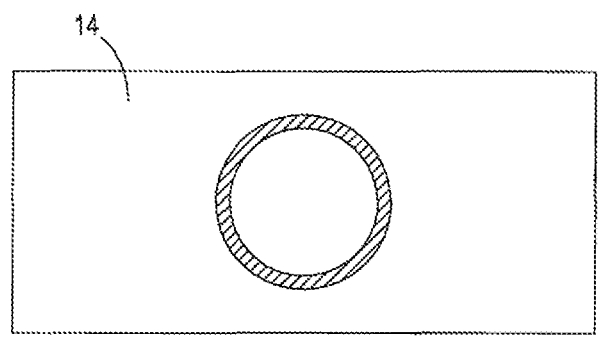

FIG. 5A is a top/front view of a substrate, showing a first surface 12 of the substrate and hydrophobic material, such as hydrophobic material 11, deposited to form a barrier 17. FIG. 5B is a bottom/back view of a substrate, showing a second surface 14 of the substrate that hydrophobic material 11 has migrated to and deposited on to form barrier 17. Thus, the combination of substrate and hydrophobic material may be selected such that practice of the methods of the embodiments allows for permeation of hydrophobic material through the substrate in such a manner that it shows-through the substrate.

Figure 6A:
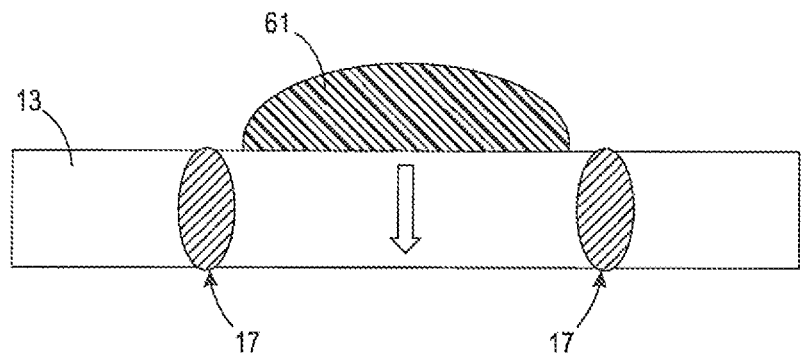
FIGS. 6A-6B illustrate liquid barrier properties of a patterned substrate that may be formed according to methods of the embodiments illustrated in any of FIG. 1A-1B, 2A-2B, or 3A-3D, and that the liquid does not permeate past barriers.
Figure 6B:
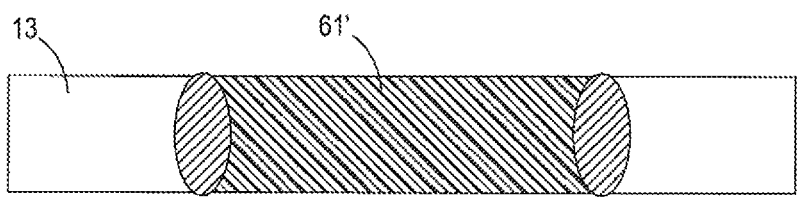
Figure 7:
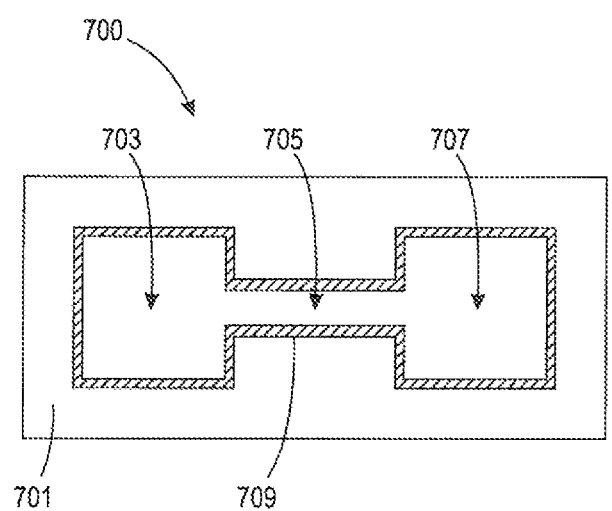
FIG. 7 illustrates an embodiment of a microfluidic device formed by patterning a substrate according to methods of the embodiments.

In an embodiment, barrier 17 is impermeable to at least some liquids, such as assay samples. For example, as shown FIG. 6A, a liquid 61 is deposited on a surface of substrate 13 in which a barrier 17 is formed according to embodiments described above, and divides the substrate into at least one discrete portion through which the liquid 61 can permeate, such as in a direction indicated by the downward pointing arrow, between a perimeter defined by barrier 17. That is, as shown in FIG. 6B, liquid 61' can permeate through a thickness of the substrate but is blocked by barrier 17 from permeating to other portions of the substrate.

In an embodiment, there is a method of forming a microfluidic device, such as microfluidic device 700. The method can include practice of the methods described above and illustrated in, for example, FIGS. 1A-1B, FIGS. 2A-2B, FIGS. 3A-3D, and FIG. 4. In other words, the method of forming a microfluidic device can include depositing a hydrophobic material on a first surface of a hydrophilic substrate in a predetermined pattern, permeating the hydrophobic material through a thickness of the substrate without reflowing the deposited hydrophobic material, and forming a liquid-impervious barrier by sufficiently solidifying the permeated hydrophobic material. Accordingly, via practice of a method of an embodiment, the substrate 701 may be patterned to comprise a sample receiving region 703, an assay region 707 and a channel region 705. In an example, the liquid-impervious barrier may define a boundary 709 of the channel region 705 so as to provide for fluidic communication between the assay region and the sample receiving region, without allowing any liquid sample to permeate through other portions of the substrate, such as exterior to the sample receiving region, assay region and the channel region. Of course, as described above, such a method may include depositing a second hydrophobic material in a second predetermined pattern on a second surface of the substrate, wherein the second surface opposes the first surface. Further, as also described above, in the method of forming a microfluidic device, the method may include permeating the second hydrophobic material through a thickness of the substrate without reflowing the second hydrophobic material and forming the liquid-impervious barrier may further include sufficiently solidifying the permeated second hydrophobic material.

The substrate may be hydrophilic, may be porous, or may comprise a combination of hydrophilicity and porosity such that the hydrophobic material wicks through a thickness of the substrate without requiring reflowing the ink. For example, the substrate may be paper, nitrocellulose, cellulose acetate, filter paper, cloth, or porous polymer film. The substrate may have a thickness of about 20 µm to about 500 µm.

UV-Light-Curable, Phase-Change Ink

The hydrophobic material 11, hydrophobic material 11', or both, may comprise a UV-light-curable, phase-change ink. A UV-light curable, phase change ink may include an ink vehicle. The ink vehicle may contain curable components of the ink. In embodiments, the ink vehicle comprises a curable monomer or oligomer. The ink vehicle may also include a curable wax, a phase change gelling agent and other optional additives such as a photoinitiator. The polymerizable monomer or oligomer may be cured via polymerization, including, for example, five radical routes, and/or in which polymerization is photoinitiated through use of a radiation sensitive photoinitiator. Accordingly, the UV-light curable, phase-change ink of the embodiments may include one or more of the following: a polymerizable monomer, a polymerizable oligomer, a curable gellant, a photoinitiator, an inhibitor (such as a photoinhibitor), and a colorant. The UV-light curable, phase-change ink may also include a wax component for controlling viscosity and extent of penetration into the substrate. The UV-light-curable, phase-change ink may also include a colorant. The colorant may include a dye, a pigment dispersion that includes a pigment and a pigment dispersant, and any combination thereof. The ink vehicle may also function as a carrier for the pigment and the dispersant.

The ink of embodiments may further include optional conventional additives to take advantage of the known functionality associated with such conventional additives. These optional additives may include surfactants, light stabilizers, which absorb incident UV radiation and convert it to heat energy that is ultimately dissipated, antioxidants, optical brighteners, which can improve the appearance of the image and mask yellowing, thixotropic agents, dewetting agents, slip agents, foaming agents, antifoaming agents, flow agents, other non-curable waxes, oils, plasticizers, binders, electrical conductive agents, fungicides, bactericides, organic and/or inorganic filler particles, leveling agents, which are agents that create or reduce different gloss levels, opacifiers, antistatic agents, dispersants, and the like. The inks may include, as a stabilizer, a radical scavenger, such as IRGASTAB UV 10 (Ciba Specialty Chemicals, Inc.). The inks may also include an inhibitor, such as a hydroquinone, to stabilize the composition by prohibiting or, at least, delaying, polymerization of the oligomer and monomer components during storage, thus increasing the shelf life of the composition. However, additives may negatively affect cure rate, and thus care must be taken when formulating a composition using optional additives. If present, the total amount of these other additives included in a the UV-light curable ink of the embodiments may be, for example, about 1 to about 15%, such as about 0.2 to about 10%, by weight of the ink.

Monomer or Oligomer

Suitable radiation-curable, such as UV-light curable, monomers and oligomers include, for example, acrylated esters, acrylated polyesters, acrylated ethers, acrylated polyethers, acrylated epoxies, urethane acrylates, and pentaerythritol tetraacrylate. Specific examples of suitable acrylated monomers include monoacrylates, diacrylates, and polyfunctional alkoxylated or polyalkoxylated acrylic monomers comprising one or more di- or tri-acrylates. Suitable monoacrylates are, for example, cyclohexyl acrylate, 2-ethoxy ethyl acrylate, 2-methoxy ethyl acrylate, 2-(2-ethoxyethoxy)ethyl acrylate, stearyl acrylate, tetrahydrofurfuryl acrylate, octyl acrylate, lauryl acrylate, behenyl acrylate, 2-phenoxy ethyl acrylate, tertiary butyl acrylate, glycidyl acrylate, isodecyl acrylate, benzyl acrylate, hexyl acrylate, isooctyl acrylate, isobornyl acrylate, butanediol monoacrylate, ethoxylated phenol monoacrylate, oxyethylated phenol acrylate, monomethoxy hexanediol acrylate, beta-carboxy ethyl acrylate, dicyclopentyl acrylate, carbonyl acrylate, octyl decyl acrylate, ethoxylated nonylphenol acrylate, hydroxyethyl acrylate, hydroxy ethyl methacrylate, and the like. Suitable polyfunctional alkoxylated or polyalkoxylated acrylates are, for example, alkoxylated, such as ethoxylated or propoxylated, variants of the following: neopentyl glycol diacrylates, butanediol diacrylates, trimethylolpropane triacrylates, glyceryl triacrylates, 1,3-butylene glycol diacrylate, 1,4-butanediol diacrylate, diethylene glycol diacrylate, 1,6-hexanediol diacrylate, tetraethylene glycol diacrylate, triethylene glycol diacrylate, tripropylene glycol diacrylate, polybutanediol diacrylate, polyethylene glycol diacrylate, propoxylated neopentyl glycol diacrylate, ethoxylated neopentyl glycol diacrylate polybutadiene diacrylate, and the like.

A suitable monomer is a propoxylated neopentyl glycol diacrylate, such as, for example, SR9003 (Sartomer Co., Inc., Exton, Pa.). Other suitable reactive monomers are likewise commercially available from, for example, Sartomer Co., Inc., Henkel Corp., Radcure Specialties, and the like. Specific examples of suitable acrylated oligomers include, for example, acrylated polyester oligomers, such as CN2262 (Sartomer Co.), EB 812 (Cytec Surface Specialties), EB 810 (Cytec Surface Specialties), CN2200 (Sartomer Co.), CN2300 (Sartomer Co.), and the like, acrylated urethane oligomers, such as EB270 (UCB Chemicals), EB 5129 (Cytec Surface Specialties), CN2920 (Sartomer Co.), CN3211 (Sartomer Co.), and the like, and acrylated epoxy oligomers, such as EB 600 (Cytec Surface Specialties), EB 3411 (Cytec Surface Specialties), CN2204 (Sartomer Co.), CN110 (Sartomer Co.), and the like; and pentaerythritol tetraacrylate oligomers, such as SR399LV (Sartomer Co.) and the like.

The curable monomer and/or oligomer may be included in the ink in an amount of, for example, about 20 to about 90% by weight of the ink, such as about 30 to about 80% by weight of the ink, or about 50 to about 70% by weight of the ink.

Curable Gellant

Any suitable gelling agent can be used for the ink vehicle. The gelling agent may be selected from, for example, the gelling agents disclosed in U.S. Pat. No. 7,279,587, incorporated herein by reference in its entirety, such as a compound of the formula:

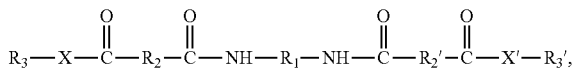

wherein: R1 is:

(i) an alkylene group (wherein an alkylene group is defined as a divalent aliphatic group or alkyl group, including linear and branched, saturated and unsaturated, cyclic and acyclic, and substituted and unsubstituted alkylene groups, and wherein heteroatoms, such as oxygen, nitrogen, sulfur, silicon, phosphorus, boron, and the like either may or may not be present in the alkylene group), having from 1 to about 12 carbon atoms, such as from 1 to 4 carbon atoms or 1 to 2 carbon atoms, although the number of carbon atoms can be outside of these ranges, (ii) an arylene group (wherein an arylene group is defined as a divalent aromatic group or aryl group, including substituted and unsubstituted arylene groups, and wherein heteroatoms, such as oxygen, nitrogen, sulfur, silicon, phosphorus, boron, and the like either may or may not be present in the arylene group), having from 5 to about 14 carbon atoms, such as from 5 to 12 carbon atoms or 5 to 10 carbon atoms, although the number of carbon atoms can be outside of these ranges, (iii) an arylalkylene group (wherein an arylalkylene group is defined as a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkylene group), having from 6 to about 32 carbon atoms, such as from 6 to 22 carbon atoms or 7 to 22 carbon atoms, although the number of carbon atoms can be outside of these ranges, or (iv) an alkylarylene group (wherein an alkylarylene group is defined as a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylarylene group), having from 6 to about 32 carbon atoms, such as from 6 to 22 carbon atoms or 7 to 22 carbon atoms, although the number of carbon atoms can be outside of these ranges, wherein the substituents on the substituted alkylene, arylene, arylalkylene, and alkylarylene groups can be, for example, halogen atoms, cyano groups, pyridine groups, pyridinium groups, ether groups, aldehyde groups, ketone groups, ester groups, amide groups, carbonyl groups, thiocarbonyl groups, sulfide groups, nitro groups, nitroso groups, acyl groups, azo groups, urethane groups, urea groups, mixtures thereof, and the like, wherein two or more substituents can be joined together to form a ring;

R2 and R2' each, independently of the other, are selected from the group consisting of: (i) alkylene groups having from 1 to about 54 carbon atoms, such as from 1 to 36 carbon atoms or 1 to 24 carbon atoms, although the number of carbon atoms can be outside of these ranges, (ii) arylene groups having from 5 to about 14 carbon atoms, such as from 5 to 10 carbon atoms or 6 to 7 carbon atoms, although the number of carbon atoms can be outside of these ranges, (iii) arylalkylene groups, having from 6 to about 32 carbon atoms, such as from 6 to 22 carbon atoms or 7 to 22 carbon atoms, although the number of carbon atoms can be outside of these ranges, or (iv) alkylarylene groups, having from 6 to about 32 carbon atoms, such as from 6 to 22 carbon atoms or 7 to 22 carbon atoms, although the number of carbon atoms can be outside of these ranges, although the number of carbon atoms can be outside of these ranges, wherein the substituents on the substituted alkylene, arylene, arylalkylene, and alkylarylene groups are the same as the above description for alkylarylene groups;

R3 and R3' each, independently of the other, are either:

(a) photoinitiating groups, such as groups derived from 1-(4-(2-hydroxyethoxy)phenyl)-2-hydroxy-2-methylpropan-1-one, of the formula

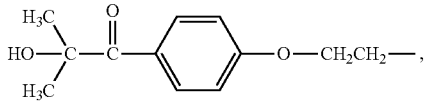

groups derived from 1-hydroxycyclohexylphenylketone, of the formula

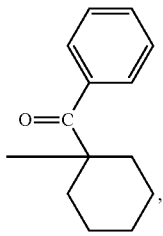

groups derived from 2-hydroxy-2-methyl-1-phenylpropan-1-one, of the formula

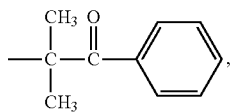

groups derived from N,N-dimethylethanolamine or N,N-dimethylethylenediamine, of the formula

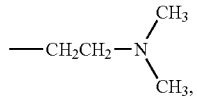

or the like, or:

(b) a group that is:

(i) an alkyl group (including linear and branched, saturated and unsaturated, cyclic and acyclic, and substituted and unsubstituted alkyl groups, and wherein heteroatoms, such as oxygen, nitrogen, sulfur, silicon, phosphorus, boron, and the like either may or may not be present in the alkyl group), having from 2 to 100 carbon atoms, such as from 3 to 60 carbon atoms or 4 to 30 carbon atoms, although the number of carbon atoms can be outside of these ranges, (ii) an aryl group (including substituted and unsubstituted aryl groups, and wherein heteroatoms, such as oxygen, nitrogen, sulfur, silicon, phosphorus, boron, and the like either may or may not be present in the aryl group), having from 5 to about 100 carbon atoms, such as from 6 to 60 carbon atoms or 7 to 30 carbon atoms, although the number of carbon atoms can be outside of these ranges, such as phenyl or the like, arylalkyl group (including substituted and unsubstituted arylalkyl groups, wherein the alkyl portion of the arylalkyl group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkyl group), having from 6 to about 100 carbon atoms, such as from 7 to 60 carbon atoms or 8 to 30 carbon atoms, although the number of carbon atoms can be outside of these ranges, such as benzyl or the like, or (iv) an alkylaryl group (including substituted and unsubstituted alkylaryl groups, wherein the alkyl portion of the alkylaryl group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylaryl group), having from 6 to about 100 carbon atoms, such as from 7 to 60 carbon atoms or 8 to 30 carbon atoms, although the number of carbon atoms can be outside of these ranges, such as tolyl or the like, wherein the substituents on the substituted alkyl, arylalkyl, and alkylaryl groups can be, for example, halogen atoms, ether groups, aldehyde groups, ketone groups, ester groups, amide groups, carbonyl groups, thiocarbonyl groups, sulfate groups, sulfonate groups, sulfonic acid groups, sulfide groups, sulfoxide groups, phosphine groups, phosphonium groups, phosphate groups, nitrile groups, mercapto groups, nitro groups, nitroso groups, sulfone groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof, and the like, wherein two or more substituents can be joined together to form a ring;

provided that X and X' each, independently of the other, is an oxygen atom or a group of the formula —NR$_4$—, wherein R$_4$ is (i) a hydrogen atom; (ii) an alkyl group, including linear and branched, saturated and unsaturated, cyclic and acyclic, and substituted and unsubstituted alkyl groups, and wherein heteroatoms either may or may not be present in the alkyl group, having from 1 to about 100 carbon atoms, such as from 2 to 60 carbon atoms or 3 to 30 carbon atoms, although the number of carbon atoms can be outside of these ranges, (iii) an aryl group, including substituted and unsubstituted aryl groups, and wherein heteroatoms either may or may not be present in the aryl group, having from 5 to about 100 carbon atoms, such as from 6 to 60 carbon atoms or 7 to 30 carbon atoms, although the number of carbon atoms can be outside of these ranges, (iv) an arylalkyl group, including substituted and unsubstituted arylalkyl groups, wherein the alkyl portion of the arylalkyl group can be linear or branched, saturated or unsaturated, and cyclic or acyclic, and wherein heteroatoms either may or may not be present in either the aryl or the alkyl portion of the arylalkyl group, having from 6 to about 100 carbon atoms, such as from 7 to 60 carbon atoms or 8 to 30 carbon atoms, although the number of carbon atoms can be outside of these ranges, or (v) an alkylaryl group, including substituted and unsubstituted alkylaryl groups, wherein the alkyl portion of the alkyl$_a$ryl group ca$_n$ be linear or branched, saturated or unsaturated, and cyclic or acyclic, and wherein heteroatoms either may or may not be present in either the aryl or the alkyl portion of the alkylaryl group, having from 6 to about 100 carbon atoms, such as from 7 to 60 carbon atoms or 8 to 30 carbon atoms, although the number of carbon atoms can be outside of these ranges, wherein the substituents on the substituted alkyl, aryl, arylalkyl, and alkylaryl groups can be, for example, halogen atoms, ether groups, aldehyde groups, ketone groups, ester groups, an groups, carbonyl groups, thiocarbonyl groups, sulfate groups, sultanate groups, sulfonic acid groups, sulfide groups, sulfoxide groups, phosphine groups, phosphonium groups, phosphate groups, nitrite groups, mercapto groups, nitro groups, nitroso groups, sulfone groups, acyl groups, acid anhydride groups, azide groups, azo groups, cyanato groups, isocyanato groups, thiocyanate groups, isothiocyanato groups, carboxylate groups, carboxylic acid groups, urethane groups, urea groups, mixtures thereof, and the like, wherein two or more substituents can be joined together to form a ring.

In embodiments, the gelling agent of the ink vehicle is an amide gelling agent of the formula:

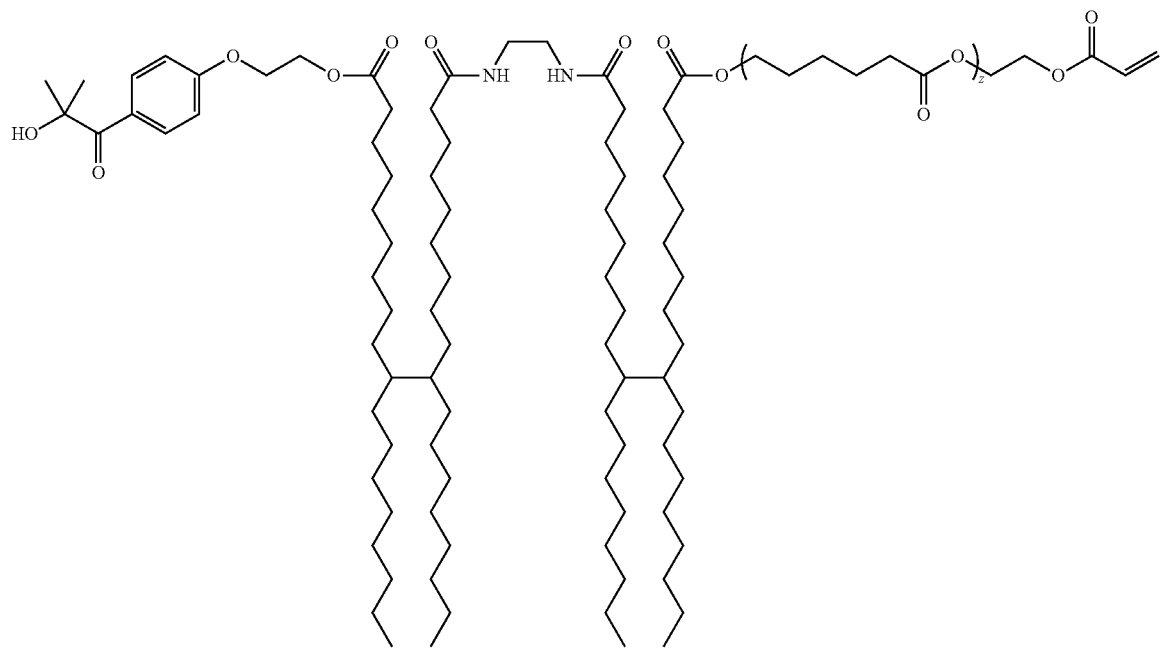

The UV-light-curable, phase change ink of embodiments may include a gellant in any suitable amount, such as about 1% to about 30% by weight of the ink. In embodiments, the gellant can be present in an amount of about 2% to about 20% by weight of the ink, such as about 5% to about 12% by weight of the ink, although the value can also be outside of this range.

Photoinitiator

The initiator can be a radical initiator. Examples of radical photoinitiators include benzophenone derivatives, benzyl ketones, monomeric hydroxyl ketones, α-amino ketones, acyl phosphine oxides, metallocenes, benzoin ethers, benzil ketals, α-hydroxyalkylphenones, α-aminoalkylphenones, acylphosphine photoinitiators sold under the trade designations of IRGACURE® and DAROCUR® from Ciba, isopropyl thioxanthenones, and the like, and mixtures and combinations thereof. Specific examples include 1-hydroxycyclohexylphenylketone, benzophenone, benzophenone derivatives, 2-benzyl-2-(dimethylamino)-1-(4-(4-morphorlinyl)phenyl)-1-butanone, 2-methyl-1-(4-methylthio)phenyl-2-(4-morphorlinyl)-1-propanone, diphenyl-(2,4,6-trimethylbenzoyl)phosphine oxide, phenyl bis(2,4,6-trimethylbenzoyl)phosphine oxide, benzyl-dimethylketal, isopropylthioxanthone, 2,4,6-trimethylbenzoyldiphenylphosphine oxide (available as BASF LUCIRIN TPO®), 2,4,6-trimethylbenzoylethoxyphenylphosphine oxide (available as BASF LUCIRIN TPO-L®), bis(2,4,6-trimethylbenzoyl)-phenyl-phosphine oxide (available as Ciba IRGACURE® 819) and other acyl phosphines, 2-methyl-1-(4-methylthio)phenyl-2-(4-morphorlinyl)-1-propanone (available as Ciba IRGACURE® 907) and 1-(4-(2-hydroxyethoxy)phenyl)-2-hydroxy-2-methylpropan-1-one (available as Ciba IRGACURE® 2959), 2-benzyl 2-dimethylamino 1-(4-morpholinophenyl)butanone-1 (available as Ciba IRGACURE® 369), 2-hydroxy-1-(4-(4-(2-hydroxy-2-methylpropionyl)-benzyl)-phenyl)-2-methylpropan-1-one (available as Ciba IRGACURE® 127), 2-dimethylamino-2-(4-methylbenzyl)-1-(4-morpholin-4-ylphenyl)-butanone (available as Ciba IRGACURE® 379), titanocenes, isopropylthioxanthenones, 1-hydroxycyclohexylphenylketone, benzophenone, 2,4,6-trimethylbenzophenone, 4-methylbenzophenone, diphenyl-(2,4,6-trimethylbenzoyl)phosphine oxide, 2,4,6-trimethylbenzoylphenylphosphinic acid ethyl ester, oligo(2-hydroxy-2-methyl-1-(4-(1-methylvinyl)phenyl)propanone), 2-hydroxy-2-methyl-1-phenyl-1-propanone, benzyl-dimethylketal, and the like, as well as mixtures thereof.

In an embodiment, the ink contains an α-amino ketone, such as, for example, IRGACURE® 379 (Ciba Specialty Chemicals), 2-hydroxy-1-(4-(4-(2-hydroxy-2-methylpropionyl)-benzyl)-phenyl)-2-methylpropan-1-one such as, for example, IRGACURE® 127 (Ciba Specialty Chemicals), bis(2,4,6-trimethylbenzoyl)-phenylphosphineoxide, such as, for example, IRGACURE® 819 and 2-isopropyl-9H-thioxanthen-9-one, such as, for example, DAROCUR® ITX (Ciba Specialty Chemicals).

The initiator may be a cationic initiator. Examples of suitable cationic photoinitiators include aryldiazonium salts, diaryliodonium salts, triarysulfonium salts, triarylselenonium salts, dialkylphenacylsulfonium salts, triarylsulphoxonium salts and aryloxydiarylsulfonium salts.

The total amount of initiator included in the UV-curable, phase-change ink of the embodiments may be, for example, about 0.5 to about 15%, such as about 1 to about 12%, or about 2 to about 10% by weight of the ink.

Colorant

As described above, the hydrophobic material of embodiments may be a UV-light-curable ink composition. In embodiments, the UV-light-curable ink compositions described herein may optionally include a colorant. Any desired or effective colorant can be employed in the phase change ink compositions, including dyes, pigments, mixtures thereof, and the like, provided that the colorant can be dissolved or dispersed in the ink carrier. Any dye or pigment may be chosen, provided that it is capable of being dispersed or dissolved in the ink carrier and is compatible with the other ink components. The colorants can be either from the cyan, magenta, yellow, black (CMYK) set or from spot colors obtained from custom color dyes or pigments or mixtures of pigments. Dye-based colorants are miscible with the ink base composition, which comprises a monomer or oligomer, a photoinitiator, an inhibitor, and a curable gellant.

The UV-light-curable ink composition may include about 0.1 wt % to about 50 wt % of colorant, such as about 0.2 wt % to about 20 wt % of colorant, or more specifically, about 0.5 wt % to about 10 wt % of colorant.

The UV-light-curable ink compositions of embodiments can be used in combination with conventional ink colorant materials, such as Color Index (C.I.) Solvent Dyes, Disperse Dyes, modified Acid and Direct Dyes, Basic Dyes, Sulphur Dyes, Vat Dyes, and the like. Examples of suitable dyes include Neozapon Red 492 (BASF); Orasol Red G (Pylam Products); Direct Brilliant Pink B (Oriental Giant Dyes); Direct Red 3BL (Classic Dyestuffs); Supranol Brilliant Red 3BW (Bayer AG); Lemon Yellow 6G (United Chemie); Light Fast Yellow 3G (Shaanxi); Aizen Spilon Yellow C-GNH (Hodogaya Chemical); Bemachrome Yellow GD Sub (Classic Dyestuffs); Cartasol Brilliant Yellow 4GF (Clariant); Cibanone Yellow 2G (Classic Dyestuffs); Orasol Black RLI (BASF); Orasol Black CN (Pylam Products); Savinyl Black RLSN (Clariant); Pyrazol Black BG (Clariant); Morfast Black 101 (Rohm & Haas); Diaazol Black RN (ICI); Thermoplast Blue 670 (BASF); Orasol Blue GN (Pylam Products); Savinyl Blue GLS (Clariant); Luxol Fast Blue MBSN (Pylam Products); Sevron Blue 5GMF (Classic Dyestuffs); Basacid Blue 750 (BASF); Keyplast Blue (Keystone Aniline Corporation); Neozapon Black X51 (BASF); Classic Solvent Black 7 (Classic Dyestuffs); Sudan Blue 670 (C.I. 61554) (BASF); Sudan Yellow 146 (C.I. 12700) (BASF); Sudan Red 462 (C.I. 26050) (BASF); C.I. Disperse Yellow 238; Neptune Red Base NB543 (BASF, C.I. Solvent Red 49); Neopen Blue FF-4012 (BASF); Lampronol Black BR (C.I. Solvent Black 35) (ICI); Morton Morplas Magenta 36 (C.I. Solvent Red 172); metal phthalocyanine colorants such as those disclosed in U.S. Pat. No. 6,221,137, the disclosure of which is totally incorporated herein by reference, and the like. Polymeric dyes can also be used, such as those disclosed in, for example, U.S. Pat. No. 5,621,022 and U.S. Pat. No. 5,231,135, the disclosures of each of which are herein entirely incorporated herein by reference, and commercially available from, for example, Milliken & Company as Milliken Ink Yellow 869, Milliken Ink Blue 92, Milliken Ink Red 357, Milliken Ink Yellow 1800, Milliken Ink Black 8915-67, uncut Reactint Orange X-38, uncut Reactint Blue X-17, Solvent Yellow 162, Acid Red 52, Solvent Blue 44, and uncut Reactint Violet X-80.

Generally, suitable pigments may be organic materials or inorganic. Magnetic material-based pigments are also suitable. Magnetic pigments include magnetic nanoparticles, such as for example, ferromagnetic nanoparticles. Examples of suitable pigments include PALIOGEN Violet 5100 (BASF); PALIOGEN Violet 5890 (BASF); HELIOGEN Green L8730 (BASF); LITHOL Scarlet D3700 (BASE); SUNFAST Blue 15:4 (Sun Chemical); Hostaperm Blue B2G-D (Clariant); Hostaperm Blue B4G (Clariant); Permanent Red P-F7RK; Hostaperm Violet BL (Clariant); LITHOL Scarlet 4440 (BASF); Bon Red C (Dominion Color Company); ORACET Pink RF (BASF); PALIOGEN Red 3871 K (BASF); SUNFAST Blue 15:3 (Sun Chemical); PALIOGEN Red 3340 (BASF); SUNFAST Carbazole Violet 23 (Sun Chemical); LITHOL Fast Scarlet L4300 (BASF); SUNBRITE Yellow 17 (Sun Chemical); HELIOGEN Blue L6900, L7020 (BASF); SUNBRITE Yellow 74 (Sun Chemical); SPECTRA PAC C Orange 16 (Sun Chemical); HELIOGEN Blue K6902 7, K6910 (BASF); SUNFAST Magenta 122 (Sun Chemical); HELIOGEN Blue D6840, D7080 (BASF); Sudan Blue OS (BASF); NEOPEN Blue FF4012 (BASF); PV Fast Blue B2GO1 (Clariant); IRGALITE Blue GLO (BASF); PALIOGEN Blue 6470 (BASF); Sudan Orange G (Aldrich); Sudan Orange 220 (BASF); PALIOGEN Orange 3040 (BASF); PALIOGEN Yellow 152, 1560 (BASF); LITHOL Fast Yellow 0991 K (BASF); PALIOTOL Yellow 1840 (BASF); NOVOPERM Yellow FGL (Clariant); Ink Jet Yellow 4G VP2532 (Clariant); Toner Yellow HG (Clariant); Lumogen Yellow D0790 (BASF); Suco-Yellow L1250 (BASF); Suco-Yellow D1355 (BASF); Suco Fast Yellow D1355, D1351 (BASF); HOSTAPERM Pink E 02 (Clariant); Hansa Brilliant Yellow 5GX03 (Clariant); Permanent Yellow GRL 02 (Clariant); Permanent Rubine L6B 05 (Clariant); FANAL Pink D4830 (BASF); CINQUASIA Magenta (DU PONT); PALIOGEN Black L0084 (BASF); Pigment Black K801 (BASF); and carbon blacks such as REGAL 330™ (Cabot), Nipex 150 (Evonik) Carbon Black 5250 and Carbon Black 5750 (Columbia Chemical), and the like, as well as mixtures thereof.

Pigment dispersions in the ink base may be stabilized by synergists and dispersants. Thus, the phase change ink compositions of embodiments may optionally include a pigment dispersant, for example, in combination with the pigment described above. The phase change solid ink may include about 1 wt % to about 30 wt % of pigment dispersant, such as about 5 wt % to about 25 wt % of pigment dispersant, or more specifically, about 5 wt % to about 20 wt % of pigment dispersant. Pigment dispersants may include, but are not limited to, MODAFLOW 2100, available from Cytec Surface Specialties, OLOA 1200, OLOA 11000, OLOA 11001, available from Chevron ORonite Company LLC, SOLSPERSE 9000, 16000, 17000, 17940, 18000, 19000, 19240, 20000, 34750, 36000, 39000, 41000, 54000 available from Lubrizol Corporation, and mixtures thereof. In embodiments, the dispersant is an amino acrylate block copolymer. The amino acrylate block copolymer includes an amino and an amino acrylate block A and an acrylate block B, the acrylate portions permitting the dispersant to be stably and well dispersed in the ink vehicle while the amino portions adsorb well to pigment surfaces. Commercially available examples of block copolymer dispersants that have been found suitable for use herein are DISPERBYK-2001 (BYK Chemie GmbH) and EFKA 4340 (Ciba Specialty Chemicals).

EXAMPLES

Example 1—Exemplary Ink Formulations

A UV-light-curable ink was formulated as follows:

To a jacketed reactor was added SR833S (226.88 g of Sartomer monomer, tricyclodecane dimethanol diacrylate; available from Arkema, Inc.), and SR399LV (16.5 g of Sartomer monomer, dipentaerythritol pentaacrylate; available from Arkema, Inc.). This was heated to 90° C. with stirring and then inhibitor IRGASTAB® UV10; available from BASF, Canada) and photoinitiators (9.9 g of IRGACURE® 379—available from BASF, 1.65 g of IRGACURE® 819—available from BASF, 13.2 g of ESACURE® KIP 150—available from Lambberti S.p.A., Italy) were added. To this was then added a curable gellant (24.75 g) selected from the curable gellants described above and stirred until completely dissolved. To this was finally added a carbon black dispersion (36.46 g of 8% solids in SR9003 monomer). This was stirred for 2 hours and then filtered through a 1 um filter to afford the desired ink.

Example 2—Paper Permeation and Liquid Barrier Test

The UV-light-curable gel ink of Example 1 was jetted at 100° C. onto Business commercial 4200 paper in a digitally-generated open circle pattern, such as that show in FIGS. 5A-5B. The sample was cured by passing under a UV lamp twice on each side at 100% intensity at 32 ft/min, forming circle-shaped barriers. After printing and curing, 1 µL of an aqueous solution of dye (blue food colouring) was added into the center one of the circles. The aqueous solution of blue dye did not significantly breach the hydrophobic ink barrier defining a hydrophilic ion of the substrate. This observation is corresponds to an indication that the wax ink not only sufficiently penetrated into the filter paper substrate, but also sufficiently solidified upon curing with the UV lamp.

Figure 8A:
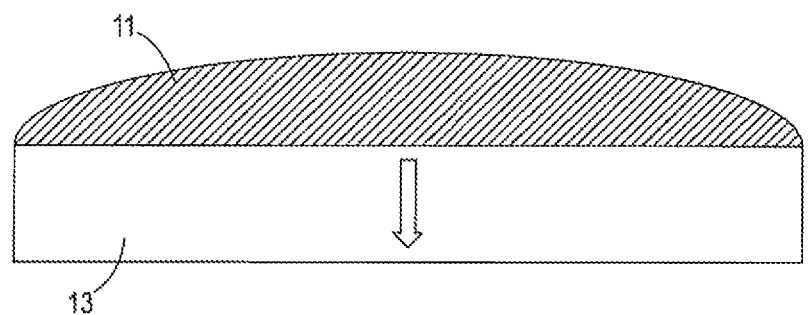
FIGS. 8A-8B show that an exemplary hydrophobic material, such as the hydrophobic material, utilized in the methods of the embodiments, penetrates into a substrate on which it is deposited.
Figure 8B:
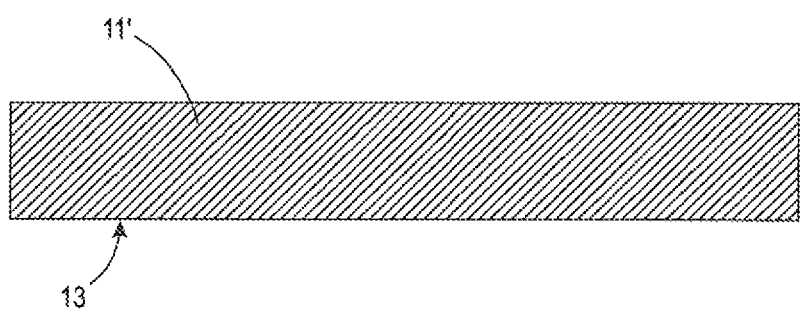
Figure 9A:
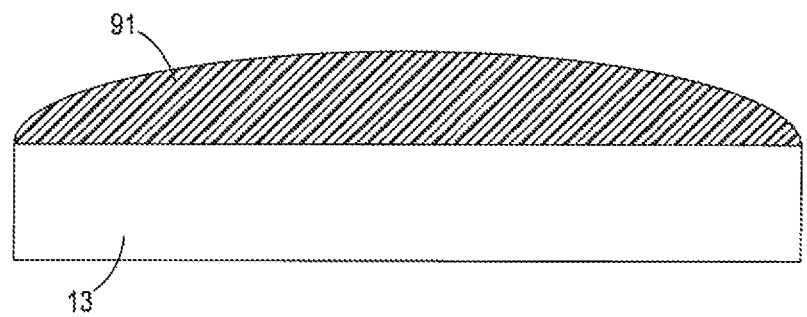
FIGS. 9A-9B illustrate that a comparative ink, such as that used in the prior art, does not penetrate into a substrate on which it is deposited.
Figure 9B:
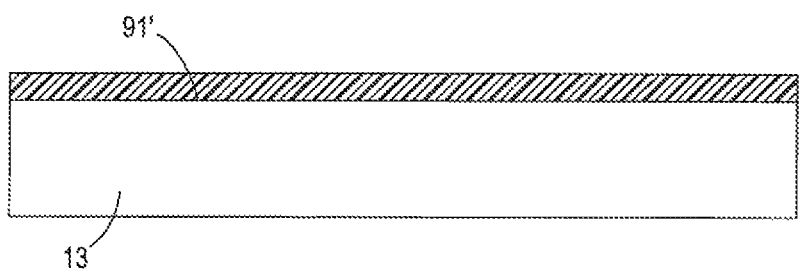

Example 3—Substrate Permeation by Exemplary Hydrophobic Material Versus by Commercial Ink The UV gel ink of Example 1 was ink-jet printed (jetted) at 100° C. onto Business commercial 4200 paper in a block pattern. Four samples were generated by printing 1, 2, 3, or 4 layers of ink on each sheet of paper. The samples were cured after printing by passing the samples twice on each side under a UV lamp at 100% intensity at 32 ft/min. Cross-sections of these samples were observed using a light microscope. Observations, represented as illustrations in FIGS. 8A-8B confirmed that the ink penetrated into the paper directly after jetting. The observed penetration of the exemplary ink into the substrate is represented in FIGS. 8A-8B, showing the ink 11 upon jetting and as ink 11' after jetting, respectively. Deposition of 3 layers of this formulation of ink was required to provide an ink volume necessary to fully penetrate the paper (1 layer of ink penetrated 55% of the thickness of the paper and 2 layers penetrated 80% of the thickness). A commercial ink was jetted (at 140° C.) onto a substrate and was observed to not have as good of penetration as compared to the exemplary ink. The observed penetration of the commercial ink into the substrate is represented as an illustration in FIGS. 9A-9B, showing the ink 91 upon jetting and as ink 91' after jetting, respectively.

Figure 10:
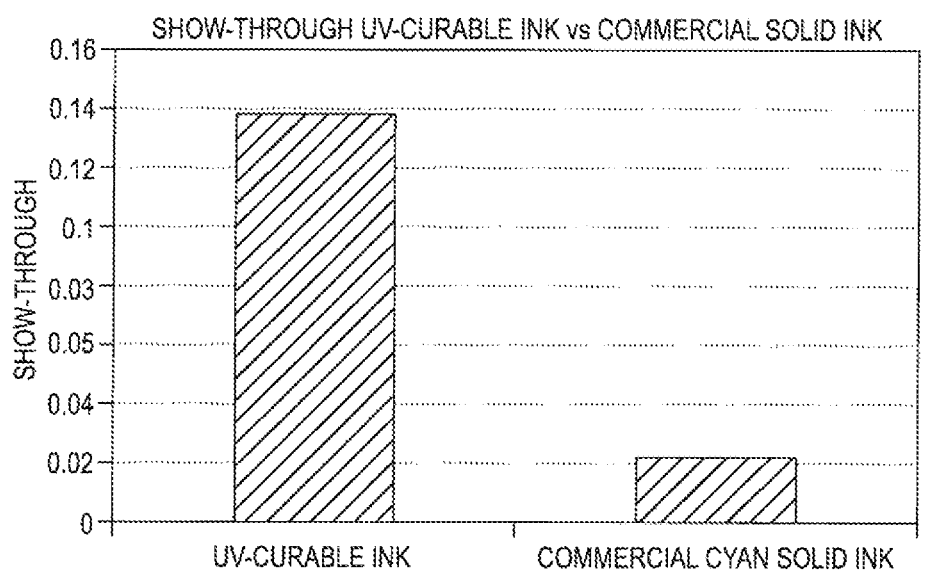
FIG. 10 is a graph showing a comparison of measured show-through of an exemplary hydrophobic material and a comparative commercial ink.
Figure 11A:
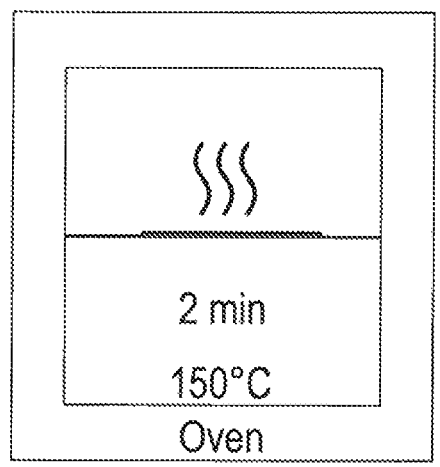
FIG. 11A is a diagram of a prior art reflow oven that melts a hydrophobic material formed on a surface of a substrate.
Figure 11B:
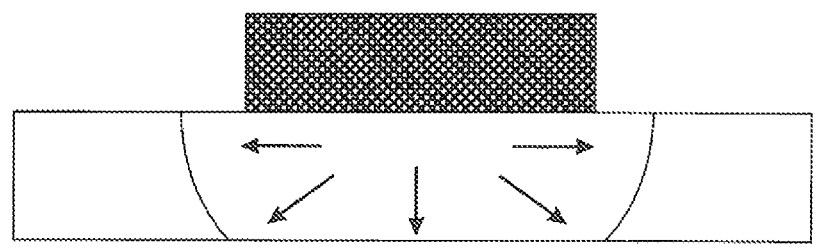
FIG. 11B is a diagram picturing the spread of a hydrophobic material on a surface of substrate in the reflow oven of FIG. 11A in a prior art spreading process.

The graph of FIG. 10 shows that the measured show-through of the UV-light-curable ink was much higher than that of the commercial solid ink which also supports better paper penetration by UV-light-curable ink compared to commercial solid ink. Show-through was calculated by measuring the difference in optical density between the backside of the paper and the front side of the paper with one blank sheet of paper on top of it divided by the optical density of the front side to normalize the result.

Example 4—Resolution Measurements

A direct printing method of an embodiment, wherein no reflowing of the deposited UV-light-curable hydrophobic material, such as the UV-light-curable ink of example 1, was performed, generated hydrophobic barriers, such as described in Example 2. For comparison, sample patterns of commercial ink and commercial ink heated in an oven at 100° C. for 1 min were also generated. All printed patterns were generated from the same file. The UV-light-curable hydrophobic ink was observed to have improved resolution as compared to barriers formed with the commercial ink. A comparison of average wall thicknesses of the barriers, measured from optical images of the front and back side of the paper substrates is provided in Table 1. Barriers were generated using the method of embodiments, wherein reflow of the deposited hydrophobic material of Formulation 1 was not performed.

TABLE 1

| Measurement # | Description | Avg. Wall Thickness (µm) |
|---|---|---|
| 1 | Formulation 1 - Substrate Top/Front view | 948 +/− 21 |
| 2 | Formulation 1 - Substrate Bottom/Back view | 913 +/− 71 |
| 3 | Commercial Ink (before heating/reflow) - Substrate Top/Front view | 742 +/− 24 |
| 4 | Commercial Ink (after heating/reflow) - Substrate Top/Front View | 1217 +/− 55 |
| 5 | Commercial Ink (after heating/reflow) - Substrate Bottom/Back view | 1186 +/− 26 |

The average wall thickness of barriers formed from the UV-light-curable ink Formulation 1 was 931±30 µm (average of the front and back of the print) compared to the average wall thickness of 1202±21 µm for barriers formed via the comparative method, in which the deposited commercial ink was heated. The feature size of the commercial ink increased by 1.6 fold after heating (742±24 µm to 1202±21 µm).

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified. Further, one or more of the acts depicted herein may be carried out in one or more separate acts and/or phases.

The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Furthermore, to the extent that the term s "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A method of patterning a substrate, comprising
depositing, in a first predetermined pattern, hydrophobic material on a first surface of a hydrophilic substrate,
permeating the hydrophobic material through a thickness of the substrate;
exposing the permeated hydrophobic material to UV-light to
solidify the permeated hydrophobic material to form a liquid-blocking barrier that separates the substrate into at least one hydrophilic zone, and
depositing, in a second predetermined pattern, hydrophobic material on a second surface of the substrate, wherein the second surface opposes the first surface;
wherein the permeating comprises the hydrophobic material wicking through a thickness of the substrate without reflowing the deposited hydrophobic material,
wherein at least a portion of hydrophobic material deposited in the first predetermined pattern and a portion of hydrophobic material deposited in the second predetermined pattern penetrate into the substrate and contact each other within the substrate, and
wherein the depositing of the first and second predetermined patterns comprises inkjet printing.

2. The method of claim 1, wherein the exposing occurs after at least a portion of the hydrophobic material permeates to and deposits itself on a second surface that opposes the first surface.

3. The method of claim 1, wherein hydrophobic material is a UV-light-curable hydrophobic material and the exposing cures the UV-light-curable hydrophobic material such that vertical migration, lateral migration or both vertical and lateral migration of the UV-light-curable hydrophobic material ceases.

4. The method of claim 1, wherein a formulation of the hydrophobic material deposited on the first surface is the same as a formulation of the hydrophobic material deposited on the second surface.

5. The method of claim 1, wherein a formulation of the hydrophobic material deposited on the first surface is different than a formulation of the hydrophobic material deposited on the second surface.

6. The method of claim 1, wherein at least a portion of the first predetermined pattern of deposited hydrophobic material and a portion of the second predetermined pattern of deposited hydrophobic material overlap, and wherein a thickness of the substrate separates the first pattern and the second pattern.

7. The method of claim 1, wherein the first predetermined pattern and the second predetermined pattern comprise a same pattern.

8. The method of claim 1, wherein the hydrophobic material comprises a UV-light-curable ink.

9. The method of claim 8, wherein the UV-light curable ink comprises a gel ink, solid ink, aqueous ink, an emulsion ink, or combinations thereof.

10. The method of claim 8, wherein the UV-light-curable ink further comprises a dye, a pigment, a pigment dispersant, or combinations thereof.

11. The method of claim 1, wherein the substrate comprises paper, nitrocellulose, cellulose acetate, filter paper, cloth, or a porous polymer film.

12. A method of forming a microfluidic device, comprising
depositing, in a first predetermined pattern, hydrophobic material on a first surface of a hydrophilic substrate,
permeating the hydrophobic material through a thickness of the substrate without reflowing the deposited hydrophobic material;
forming a liquid-impervious barrier by exposing the hydrophobic material to UV-light,
wherein the depositing of the hydrophobic material in the first predetermined pattern comprises inkjet printing, and
depositing, in a second predetermined pattern, hydrophobic material on a second surface of the substrate, wherein the second surface opposes the first surface;
permeating the second hydrophobic material through a thickness of the substrate without reflowing the second hydrophobic material; and
wherein forming the liquid-impervious barrier further comprises exposing the hydrophobic material deposited in the second predetermined pattern to UV-light,
wherein the hydrophilic substrate comprises a sample receiving region, an assay region and a channel region.

13. The method of claim 12, wherein the liquid-impervious barrier defines a boundary of the channel region and provides for fluidic communication between the assay region and the sample receiving region.

14. The method of claim 12, wherein the hydrophobic material comprises UV-light-curable hydrophobic material.

15. The method of claim 1, wherein a temperature of the hydrophobic material when deposited comprises about 70° C. to about 150° C.

16. The method of claim 1, wherein a temperature of the hydrophobic material when deposited comprises about 100° C. to about 145° C.

17. The method of claim 12, wherein the depositing of the hydrophobic material in the second predetermined pattern comprises inkjet printer.

* * * * *